United States Patent
Krauss

(10) Patent No.: US 8,461,905 B2
(45) Date of Patent: Jun. 11, 2013

(54) ADAPTIVE BOOTSTRAP CIRCUIT FOR CONTROLLING CMOS SWITCH(ES)

(75) Inventor: Mathias Krauss, Dresden (DE)

(73) Assignee: Zentrum Mikroelektronic Dresden AG, Dresden (DE)

( * ) Notice: Subject to any disclaimer, the term of this patent is extended or adjusted under 35 U.S.C. 154(b) by 35 days.

(21) Appl. No.: 13/143,618

(22) PCT Filed: Jan. 7, 2010

(86) PCT No.: PCT/US2010/020340
§ 371 (c)(1),
(2), (4) Date: Sep. 26, 2011

(87) PCT Pub. No.: WO2010/080889
PCT Pub. Date: Jul. 15, 2010

(65) Prior Publication Data
US 2012/0013391 A1    Jan. 19, 2012

Related U.S. Application Data

(60) Provisional application No. 61/142,916, filed on Jan. 7, 2009.

(51) Int. Cl.
*H03K 17/687* (2006.01)
*H03K 17/16* (2006.01)

(52) U.S. Cl.
USPC ............ 327/427; 327/434; 327/437; 327/389; 327/391

(58) Field of Classification Search
None
See application file for complete search history.

(56) References Cited

U.S. PATENT DOCUMENTS

| | | | | |
|---|---|---|---|---|
| 4,794,283 A | * | 12/1988 | Allen et al. | 326/68 |
| 5,111,081 A | * | 5/1992 | Atallah | 326/32 |
| 5,905,399 A | * | 5/1999 | Bosnyak et al. | 327/384 |
| 6,215,348 B1 | * | 4/2001 | Steensgaard-Madsen | 327/390 |
| 6,380,792 B1 | | 4/2002 | Yamamoto | |
| 6,404,237 B1 | * | 6/2002 | Mathew et al. | 326/113 |
| 6,714,046 B2 | * | 3/2004 | Fujikawa et al. | 326/62 |
| 6,794,905 B2 | * | 9/2004 | Sato et al. | 326/108 |
| 7,782,116 B2 | * | 8/2010 | Jasa et al. | 327/389 |
| 2003/0184337 A1 | | 10/2003 | Huang et al. | |
| 2006/0267670 A1 | | 11/2006 | Koyama et al. | |
| 2008/0084803 A1 | | 4/2008 | Chen et al. | |
| 2011/0193615 A1 | * | 8/2011 | Ono | 327/437 |

OTHER PUBLICATIONS

International Search Report for PCT/US2010/020340 dated May 4, 2010.

* cited by examiner

*Primary Examiner* — Tuan T Lam
(74) *Attorney, Agent, or Firm* — Kevin P. Radigan, Esq.; Heslin Rothenberg Farley & Mesiti P.C.

(57) ABSTRACT

An adaptive switch circuit is provided, which includes a CMOS switch, an off-level voltage generator, and a booster circuit. The CMOS switch includes first PMOS and NMOS coupled transistors. The generator provides, via first and second outputs, first and second voltage levels, and includes second PMOS and NMOS transistors. The second PMOS transistor is series connected between VDD and a first bias source and the second NMOS transistor is series connected between VSS and a second bias source. The booster circuit, which is coupled to the generator between its outputs, and to the PMOS and NMOS gates of the CMOS switch, capacitively stores during off level first and second boost voltages, which are coupled to the PMOS and NMOS gates. The boost voltages are offset from VDD and VSS, respectively, each by approximately a threshold voltage of the respective transistor type.

14 Claims, 1 Drawing Sheet

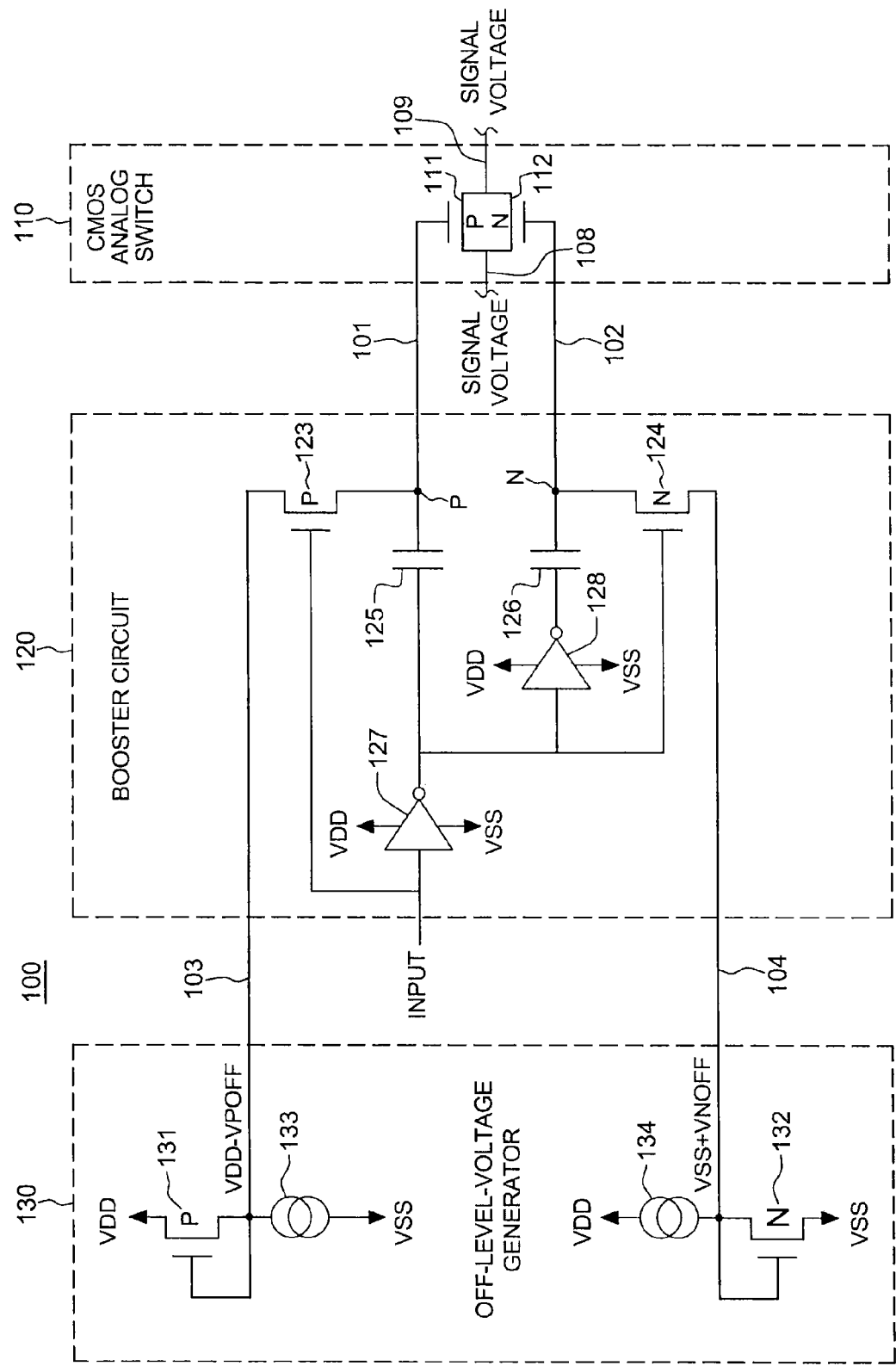

ADAPTIVE BOOTSTRAP CIRCUIT FOR CONTROLLING CMOS SWITCH(ES)

This application is a national stage filing under section 371 of International Application No. PCT/US2010/020340 filed on Jan. 7, 2010, and published in English on Jul. 15, 2010 as WO 2010/080889 and claims the benefit of U.S. Provisional Application No. 61/142,916, filed Jan. 7, 2009, the entire disclosure of these applications being hereby incorporated herein by reference in their entirety.

BACKGROUND

The present invention relates in general to semiconductor technology, and more specifically, to a circuit for facilitating operation of Complementary Metal-Oxide Semiconductor (CMOS) devices, such as CMOS switches.

To control a CMOS analog switch, such as a switched capacitor (SC) circuit, two complementary control signals are typically employed. These control signals are able to fully open or close the two complementary MOSFETs of the SC circuit. For control levels, the two supply voltages VDD and VSS of an integrated circuit are normally used. Disadvantageously, the trend towards ever smaller operating voltages drastically reduces the effective control voltage available to open the MOSFETs of an SC circuit. A critical case arises if the signal voltage is approximately VDD/2. At this condition, the effective control voltage to the N-MOSFET of the SC circuit would be:

$$VCN=-VDD-VTHN-VDD/2=VDD/2-VTHN$$

and the effective control voltage to the P-MOSFET of the SC circuit would be:

$$VCP=-VDD/2-VTHP.$$

Considering that the amount of the two threshold voltages is further increased by the body-effect and taking into account technological dispersions, the effective control voltage at supply voltages as small as 2.4 volts almost becomes zero, and thus, proper working of an SC circuit with small operating voltages (e.g., 1.8 V) would not be possible.

BRIEF SUMMARY

In one aspect, the shortcomings of the prior art are overcome and additional advantages are provided through the provision of an adaptive switch circuit for an integrated circuit using voltage sources VDD and VSS. The adaptive switch circuit includes a CMOS switch, an off-level voltage generator, and a booster circuit. The CMOS switch includes a first PMOS transistor coupled to a first NMOS transistor, and comprises a PMOS gate, an NMOS gate, an input Vin and an output Vout. The off-level voltage generator provides, via a first output, a first voltage level and, via a second output, a second voltage level, and comprises a second PMOS transistor and a second NMOS transistor, the second PMOS transistor being series connected between VDD and a first bias source, and the second NMOS transistor being series connected between VSS and a second bias source, with the first output being from a node between the series connected second PMOS transistor and first bias source and the second output being from a node between the series connected second NMOS transistor and the second bias source. The booster circuit is coupled to the off-level voltage generator between the first output and the second output thereof, and is coupled to the PMOS gate and to the NMOS gate of the CMOS switch for gating the CMOS switch. The booster circuit capacitively stores during off level a first boost voltage and a second boost voltage, the first boost voltage being coupled to the PMOS gate and the second boost voltage being coupled to the NMOS gate, wherein the first boost voltage and the second boost voltage are offset from VDD and VSS respectively, each by approximately a threshold voltage of the respective transistor type.

Additional features and advantages are realized through the techniques of the present invention. Other embodiments and aspects of the invention are described in detail herein and are considered a part of the claimed invention.

BRIEF DESCRIPTION OF THE DRAWING

One or more aspects of the present invention are particularly pointed out and distinctly claimed as examples in the claims at the conclusion of the specification. The forgoing and other objects, features, and advantages of the invention are apparent from the following detailed description taken in conjunction with the accompanying drawing in which:

FIG. 1 is a schematic of one embodiment of an adaptive switch circuit comprising a CMOS switch, a booster circuit, and an off-level voltage generator, in accordance with an aspect of the present invention.

DETAILED DESCRIPTION

One type of solution to the above-noted problem are so called clock boosters, which either produce a main boosted voltage by means of a charge pump in order to provide increased control voltage levels, or which individually boost the control voltages for each CMOS switch. The main charge pump approach has the disadvantage of producing higher energy dissipation, as well as producing additional interference voltages, and requiring level transducers. Thus, an individual booster approach may be preferred. With the individual booster approach, simplicity of the booster circuit and a small area requirement are significant considerations. A further criterion is a limitation of the control voltage to values which do not promote destruction of the gate oxide. This is important in particular if, as with many battery-operated circuits, the supply voltage range varies, e.g., anywhere from 1.8V to 3.6V.

Provided herein, in one aspect, is the provision of a switching configuration which facilitates adaptive adjustment of control voltage levels to desired levels via an uncomplicated means, so that at small supply voltages, a sufficient opening of the MOSFETs is ensured, and at larger supply voltages, damage to their gate oxide is avoided, and further that the off-level (or off state) of the MOSFETs is guaranteed.

FIG. 1 depicts one embodiment of an adaptive switch circuit, generally denoted 100, in accordance with an aspect of the present invention. Adaptive switch circuit 100 includes a CMOS switch 110, a booster circuit 120, and an off-level voltage generator 130. CMOS switch 110 is an analog switch which includes a coupled first PMOS transistor 111 and first NMOS transistor 112, as well as a PMOS gate 101, an NMOS gate 102, an input Vin 108 and an output Vout 109.

Booster circuit 120 includes a level control PMOS transistor 123, a level control NMOS transistor 124, a first voltage boost capacitor 125, a second voltage boost capacitor 126 and inverting drivers 127, 128.

Off-level voltage generator 130 includes a second PMOS transistor 131, and a second NMOS transistor 132, which are biased by first and second bias sources 133, 134, respectively. In one example, bias sources 133, 134 are bias current sources implemented using high impedance resistors. Note that conventionally, VDD is the positive supply voltage to the FET circuitry, while VSS is the negative supply voltage to the FET circuitry and may be, for example, ground potential. As illustrated, in one embodiment, off-level voltage generator 130 provides, via a first output 103, a first voltage level (i.e., VDD−VPOFF), and via a second output 104, a second voltage level (i.e., VSS+VNOFF).

Note that the first voltage level (i.e., the first off-level voltage) is generated at a node between a series connection of second PMOS transistor 131 (connected to VDD), and first bias source 133 (connected to VSS). In one embodiment, first bias source 133 is a resistor with high impedance. Alternatively, circuitry comprising one or more diodes and transistors may be employed in implementing bias source 133. Similarly, the second voltage level (second off-level voltage) is generated at a node between a series connection of second NMOS transistor 132 (connected to VSS), and second biasing source 134 (connected to VDD). In one embodiment, biasing source 134 may comprise a high impedance resistor. However, one or more diodes or transistors may again be employed to implement the biasing source if desired.

In one embodiment, second PMOS transistor 131 and second NMOS transistor 132 are implemented in diode configuration, and VPOFF is the voltage drop over bias source 133, while VNOFF is the voltage drop over bias source 134. The series connection of second PMOS transistor with bias source 133 prevents a short circuit between VDD and VSS, while the series connection between second NMOS transistor 132 and bias source 134 prevents a short circuit between VDD and VSS. As noted, the two series connected circuits are employed in respectively generating VPOFF and VNOFF.

Booster circuit 120 is coupled to off-level voltage generator 130 between first output 103 and second output 104, and couples to PMOS gate 101 and NMOS gate 102 of CMOS switch 110 as illustrated in FIG. 1. Note that off-level voltage generator 130 may be a dedicated voltage generator for adaptive switch circuit 100, or may be, for example, a centralized voltage generator employed by multiple booster circuits 120, and thus, multiple adaptive switch circuits.

Advantageously, the adaptive switch circuit of FIG. 1 employs simple driver inverters 127, 128 within booster circuit 120, whose output voltage swing is limited on VDD−VSS, and provides a capacitive boosting of the gate voltage of transistor 111 and/or transistor 112 by just one threshold voltage. This is achieved, in part, by offsetting the off-level switch transistor voltage by the threshold voltage of the respective transistor type.

Thus, when switching the driver inverter INPUT to booster circuit 120 to open CMOS switch 110 (where it is presumed that CN>>CGN and CP>>CGP), the voltage at the gate of the N-MOSFET will be pumped from VSS+VTHN to VDD+VTHN, and the voltage at the gate of the P-MOSFET will be pumped from VDD+VTHP to VSS+VTHP. When closing the CMOS switch, level control transistors 123, 124 will restore the off levels VDD+VTHP and/or VSS+VTHN, and the capacitors 125, 126 will be recharged for the next pump event according.

Note that the off-level generation by means of a transistor of the same type as the transistor to be switched off, ensures that an adaptive adjustment of the off-level voltage occurs for different operating conditions, temperatures and process variations. Boosting the gate voltage by maximally one threshold voltage when opening the transistors secures a sufficient on-resistance in the case of small operating voltages, and it prevents damage to the gate oxide in the case of large operating voltages.

Operation of the adaptive booster is further described below with reference to FIG. 1. As noted, in one embodiment, off-level voltage generator 130 provides two voltage levels, which are a voltage drop across second bias source 132 (VNOFF) above VSS (on output line 104) and a voltage drop across first bias source 131 (VPOFF) below VDD (on output line 103). These voltage levels may be generated by a wide, short channel N-MOSFET and a wide, short channel P-MOSFET in diode configuration, which are biased by very small currents in order to make those voltage drops very close to their threshold voltages.

Assuming that there is a low level at the control INPUT to booster circuit 120, P-MOSFET 123 connects node P to VDD−VPOFF and N-MOSFET 124 connects node N to VSS+VNOFF. PMOS transistor 111 and NMOS transistor 112 of CMOS switch 110 are then at off-level (off state), with the signal voltage at least some small amount apart from the rails. To ensure the off state, the diode configured second PMOS and second NMOS transistors 131, 132 may be designed using a minimum channel length, whereas the switching transistors (i.e., PMOS transistor 111 and NMOS transistor 112) may be designed using other than the shortest possible channel length to prevent leakage current. With such an implementation, the short channel effect, which results in a somewhat smaller amount of threshold voltage for the second PMOS and second NMOS transistors 131, 132 compared to first PMOS and first NMOS transistors 111, 112 of CMOS switch 110, helps to buffer distribution tolerances which could compromise the off state of the switching transistors (i.e., PMOS transistor 111 and NMOS transistor 112). The voltage boost capacitors 125 and 126 are pre-charged (or recharged) to VDD−VPOFF−VSS and VSS+VNOFF−VDD during off-level on the INPUT to booster circuit 120. As illustrated in FIG. 1, voltage boost capacitor 125 is connected to node P, which is connected to PMOS gate 101 of CMOS switch 110, while voltage boost capacitor 126 is connected to node N, which is connected to NMOS gate 102 of CMOS switch 110. The boost voltages are the threshold voltages of the switch transistors, that is, PMOS transistor 111 and NMOS transistor 112, and are necessarily some small amount separated from the power source rails VDD and VSS.

When the control INPUT turns from low to high, node P moves to VSS−VPOFF and node N moves to VDD +VNOFF under the assumption that the voltage boost capacitors 125 and 126 are large compared with the gate capacitance of the switching transistors (i.e., first PMOS transistor 111 and first NMOS transistor 112 of the CMOS analog switch 110). Thus, the amount of boosting employed by the adaptive circuit for each transistor is only one threshold voltage, compared to a non-boosted control of the switches. This difference is large enough to enable the switch capacitor functionality at low supply voltages and small enough to prevent gate oxide degradation at higher supply voltages. The adaptive behavior of the VPOFF and VNOFF values guarantees functionality over a wide range of supply voltages, temperatures and process variations.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined by the following claims.

What is claimed is:

1. An adaptive switch circuit using voltage sources VDD and VSS, the adaptive switch circuit comprising:

a CMOS switch comprising a first PMOS transistor coupled to a first NMOS transistor, the CMOS switch further comprising a PMOS gate, an NMOS gate, an input Vin and an output Vout;

an off-level voltage generator providing, via a first output, a first voltage level and, via a second output, a second voltage level, the off-level voltage generator comprising a second PMOS transistor and a second NMOS transistor, the second PMOS transistor being series connected between VDD and a first bias source and the second NMOS transistor being series connected between VSS and a second bias source, the first output being from a node between the series connected second PMOS transistor and first bias source and the second output being from a node between the series connected second NMOS transistor and the second bias source;

a booster circuit coupled to the off-level voltage generator, between the first output and the second output thereof, and coupled to the PMOS gate and to the NMOS gate of the CMOS switch for facilitating gating of the CMOS switch, the booster circuit capacitively storing during off level a first boost voltage and a second boost voltage, the first boost voltage being coupled to the PMOS gate and the second boost voltage being coupled to the NMOS gate, and the first boost voltage and the second boost voltage being offset from VDD and VSS, respectively, each by approximately a threshold voltage of the respective transistor type, and each providing a capacitive boosting of the gate voltage at the respective PMOS gate or NMOS gate of the CMOS switch by the threshold voltage of the corresponding transistor type.

2. The adaptive switch circuit of claim 1, wherein the first voltage level provided by the off-level voltage generator is VDD−VPOFF and the second voltage level is VSS+VNOFF, wherein VPOFF is a voltage drop across the first bias source and VNOFF is a voltage drop across the second bias source.

3. The adaptive switch circuit of claim 2, wherein in off level the booster circuit applies the first voltage level to the PMOS gate and applies the second voltage level to the NMOS gate.

4. The adaptive switch circuit of claim 1, wherein the second PMOS transistor and the second NMOS transistor of the off-level voltage generator each have a smaller channel length than the first PMOS transistor and the first NMOS transistor of the CMOS switch, respectively.

5. The adaptive switch circuit of claim 1, wherein the booster circuit comprises a first voltage boost capacitor electrically coupled to the PMOS gate of the CMOS switch and a second voltage boost capacitor electrically coupled to the NMOS gate of the CMOS switch.

6. The adaptive switch circuit of claim 5, wherein the booster circuit further comprises first and second inverting drivers driving the first voltage boost capacitor and the second voltage boost capacitor, respectively, wherein output variation of the first and second inverting drivers is limited to between VDD and VSS.

7. The adaptive switch circuit of claim 5, wherein in off level the first voltage boost capacitor is charged to VDD−VPOFF−VSS and the second voltage boost capacitor is charged to VSS+VNOFF−VDD.

8. The adaptive switch circuit of claim 7, wherein in transitioning to on-level, control voltage to the PMOS gate moves to VSS−VPOFF and control voltage to the NMOS gate moves to VDD+VNOFF.

9. The adaptive switch circuit of claim 8, wherein in a next off level the first and second voltage boost capacitors are recharged for a next on level pump event.

10. The adaptive switch circuit of claim 1, wherein the second PMOS transistor and the second NMOS transistor are short channel transistors applied in diode configuration.

11. The adaptive switch circuit of claim 1, in combination with at least one other adaptive switch circuit, wherein the off-level voltage generator of the adaptive switch circuit provides the first voltage level and the second voltage level to at least one other booster circuit of the at least one other adaptive switch circuit as well.

12. The adaptive switch circuit of claim 1, wherein the first bias source of the off-level voltage generator comprises a first bias current source and the second bias source comprises a second bias current source, the first bias current source and the second bias current source being implemented using impedance resistors.

13. The adaptive switch circuit of claim 1, wherein the booster circuit further comprises a third PMOS transistor and a third NMOS transistor, the third PMOS transistor being a level control PMOS transistor coupled between the first output of the off-level voltage generator and the PMOS gate of the CMOS switch, and the third NMOS transistor being a level control NMOS transistor coupled between the second output of the off-level voltage generator and the NMOS gate of the CMOS switch.

14. The adaptive switch circuit of claim 1, wherein the booster circuit further comprises:
  a first voltage boost capacitor electrically coupled to the PMOS gate of the CMOS switch and a second voltage boost capacitor electrically coupled to the NMOS gate of the CMOS switch;
  first and second inverting drivers driving the first voltage boost capacitor and the second voltage boost capacitor, respectively, wherein output variation of the first and second inverting drivers is limited to between VDD and VSS; and
  a third PMOS transistor and a third NMOS transistor, the third PMOS transistor being a level control PMOS transistor coupled between the first output of the off-level voltage generator and the PMOS gate of the CMOS switch, and the third NMOS transistor being a level control NMOS transistor coupled between the second output of the off-level voltage generator and the NMOS gate of the CMOS switch.

* * * * *